United States Patent [19]

Hawkins et al.

[11] Patent Number: 5,314,789
[45] Date of Patent: May 24, 1994

[54] METHOD OF FORMING A RELIEF IMAGE COMPRISING AMPHOTERIC COMPOSITIONS

[75] Inventors: Robert E. Hawkins, Upton; Daniel Y. Pai, Millbury, both of Mass.

[73] Assignee: Shipley Company Inc., Marlborough, Mass.

[21] Appl. No.: 770,016

[22] Filed: Oct. 1, 1991

[51] Int. Cl.⁵ .......................... G03F 7/30; G03C 1/73; C25D 13/06

[52] U.S. Cl. .................................. 430/325; 430/281; 430/935; 204/181.6; 204/181.7; 204/180.6

[58] Field of Search .............. 430/315, 271, 286, 314, 430/281, 910, 935, 306, 325; 427/98; 204/180.6, 181.4, 181.6, 181.7

[56] References Cited

U.S. PATENT DOCUMENTS

| | | | |
|---|---|---|---|
| 3,853,803 | 12/1974 | Anderson et al. | 260/29.6 TA |
| 3,971,709 | 7/1976 | Ohsawa et al. | 204/181 |
| 4,293,635 | 10/1981 | Flint et al. | 430/281 |
| 4,592,816 | 6/1986 | Emmons et al. | 204/180.6 |
| 4,632,900 | 12/1986 | Demmer et al. | 430/323 |
| 4,839,253 | 6/1989 | Demmer et al. | 430/190 |
| 4,877,818 | 10/1989 | Emmons et al. | 522/26 |
| 4,898,656 | 2/1990 | Hoshino et al. | 204/181.1 |
| 4,898,686 | 2/1990 | Hoshino et al. | 204/181.1 |
| 4,904,568 | 2/1990 | Kondo et al. | 430/294 |
| 4,965,073 | 10/1990 | Maruyama et al. | 430/292 |
| 4,975,351 | 12/1990 | Akaki et al. | 430/190 |
| 5,002,858 | 3/1991 | Demmer et al. | 430/325 |
| 5,004,672 | 4/1991 | D'Ottavio et al. | 430/314 |
| 5,055,164 | 10/1991 | Hawkins et al. | 204/15 |
| 5,073,478 | 12/1991 | Banks et al. | 430/317 |
| 5,080,998 | 1/1992 | Irving et al. | 430/169 |

FOREIGN PATENT DOCUMENTS 265387 4/1988 European Pat. Off. .
87810602.0 4/1988 European Pat. Off. .

*Primary Examiner*—Marion E. McCamish
*Assistant Examiner*—Rosemary Ashton
*Attorney, Agent, or Firm*—Robert L. Goldberg; Peter F. Corless

[57] ABSTRACT

The invention provides radiation sensitive compositions that comprise an amphoteric polymer, the polymer comprising at least two distinct carrier groups so that the polymer is positively polarized or negatively polarized upon treatment with an acid or base, respectively, enabling the compositions to be electrodeposited either anaphoretically or cataphoretically. Employing this amphoteric polymer in a radiation sensitive composition also allows the use of either an acid or base solution to image and remove the deposited composition irrespective of whether the composition was applied cataphoretically or anaphoretically. The compositions of the invention are also suitably formulated as liquid coating compositions or used to form dry film resists.

30 Claims, No Drawings

5,314,789

METHOD OF FORMING A RELIEF IMAGE COMPRISING AMPHOTERIC COMPOSITIONS

BACKGROUND OF THE INVENTION

1. Field of the Invention

This invention relates to radiation sensitive compositions. The compositions have particular utility in electrophoretic deposition processes including the manufacture of electronic printed circuit boards and other electronic packaging substrates. More specifically, the amphoteric compositions of the invention contains a polymer that can be selectively treated to render the composition either anodic or cathodic as desired and imaged and stripped in either acid or base chemistries.

2. Background Art

Radiation sensitive compositions include photoresists which are photosensitive coatings capable of transferring an image onto a conductive substrate such as a printed circuit board or a lithographic plate. The photoresist may be of the liquid type which is typically applied by dip-coating, roller-coating, spin-coating or by screen printing. These resists can be negative-acting or positive-acting. In the case of negative-acting resists, after the film is deposited on a surface and the solvent is removed as by heating, the film is selectively exposed, typically through a photomask, to a source of activating energy such as ultraviolet light. The photomask has areas that are opaque and other areas that are transparent to the ultraviolet light. The pattern on the photomask formed by opaque and transparent areas defines the pattern, such as a circuit, to be transferred to the substrate.

Exposed portions of a negative-acting photoresist become less soluble in a developing solution than unexposed areas as the result of a photochemical reaction, for example, between a photoinitiator and an ethylenically unsaturated resin of the resist composition. This difference in solubility allows for the selective removal of the photoresist and the transfer of the photomask image to the substrate. In the case of positive-acting photoresists, exposure to activating radiation will cause the coating to become more soluble in a developing solution than the unexposed areas. Such photoresists are generally well known and are typically formulated from materials such as vinyl cinnamate copolymers, such as disclosed in U.S. Pat. Nos. 2,737,297; 2,739,892; and 2,801,233; benzal acetophenones such as disclosed in U.S. Pat. Nos. 2,716,097 and 2,716,102; quarternary salts such as disclosed in U.S. Patent No. 2,908,667; azide polymers such as disclosed in U.S. Pat. No. 2,948,610; and naphthaquinone diazide esters and amides such as disclosed in U.S. Pat. Nos. 3,634,082; 4,148,654 and 4,439,516, all incorporated herein by reference. The imaged photoresist may act as a protective coating for subtractively etching the metal substrate, known as print-and-etch, or allow the exposed bare metal surface to be further built up in thickness by electroplating methods, known as print-and-plate. The resist may then be selectively stripped. For print-and-plate processes, the exposed metal on the substrate may be etched to form the desired pattern or circuit on the substrate surface. The historical background, types and operation of conventional photoresists, are generally described in Photoresist Materials and Processes, W. DeForest, McGraw-Hill, 1975.

Another type of photoresist is commonly referred to as dry film. A dry film resist is a multilayer film in which a solid photosensitive film is sandwiched between a polyethylene film and polyester cover sheet. Dry film resists are described, for example, in U.S. Pat. Nos. 3,469,982, 4,378,264 and 4,343,885. As in liquid resists, they can be either negative or positive acting. Dry film resists are typically laminated onto a printed circuit board by application with hot rollers, after the bottom polyethylene film is peeled from the remaining photoresist film and polyester cover sheet. The transparent cover sheet usually remains on the board to provide mechanical support and to protect the photoresist. After exposure to activating radiation, the cover sheet is removed prior to development.

Electrophoretic deposition of certain photoresist coatings has been reported. Electrophoretic deposition involves a process of electrophoresis which is the motion of charged particles through a liquid medium under the influence of an applied electrical field. The deposition is conducted in a cell with the conductive substrate to be coated serving as one of the electrodes. Deposition of a positively charged material or mixture of materials onto a negatively charged cathode is referred to as cataphoresis while deposition of a negatively charged material or mixture of materials onto a positively charged anode is referred to as anaphoresis.

U.S. Pat. No. 3,738,835 describes the use of anaphoresis to deposit a photosensitive composition of polychloroprene polymer and a photosensitizer such as 4,4-bis(-dimethylamino)-benzophenone in a mixed organic solvent. U.S. Pat. Nos. 3,954,587; 4,029,561; 4,035,273; 4,035,274; 4,039,414; 4,066,523; 4,070,258; and 4,166,017 also describe coatings that are applied electrophoretically and exposed to activating radiation.

U.S. Pat. No. 4,592,816 describes a negative-acting electrophoretic photoresist that contains at least one polymer that incorporates an ionizable group. The described photoresist compositions incorporate the use of ethylenic unsaturated monomers to crosslink a film layer. For the cataphoretic photoresists described, the developer and stripper solutions required to remove desired areas of the photoresist are acidic in nature. The described anaphoretic photoresists require the use of base to develop an image. This generally exemplifies the art in that known cataphoretic negative working photoresists are imaged and removed only in acid solutions such as lactic acid; and, in like manner, known anaphoretic negative working photoresists are imaged and removed only in base solutions. Such restriction of development and stripping chemistries can impose significant limitations in some processes.

It thus would be desirable to have a cataphoretic photoresist that could be developed and/or stripped with a base solution, and to have an anaphoretic photoresist that could be developed and/or stripped with an acidic solution. It also would be desirable to have a single radiation sensitive composition that could be electrodeposited on a conductive substrate either cataphoretically or anaphoretically. It would be further desirable if such a composition could be formulated as a liquid coating composition or used to form a dry film resist.

SUMMARY OF THE INVENTION

The present invention provides amphoteric radiation sensitive compositions that can be electrophoretically deposited on a conductive surface either anaphoretically or cataphoretically. The invention is based on the discovery of an amphoteric polymer and the use thereof in radiation sensitive compositions. This amphoteric polymer comprises both cataphoretic carrier groups and anaphoretic carrier groups. The anaphoretic carrier groups are negatively charged, ionized or otherwise negatively polarized groups, or groups that are capable of being negatively charged, ionized or otherwise negatively polarized upon treatment with a base. The cataphoretic carrier groups are positively charged, ionized or otherwise polarized groups, or groups that are capable of being positively charged, ionized or otherwise polarized upon treatment with an acid. The acidic or basic materials used to charge, ionize or otherwise provide polarity to the carrier groups are sometimes referred to herein as "ionizers" or "ionizer solutions". The anaphoretic carrier groups are typically substantially neutral when treated with an acid, and the cataphoretic carrier groups are typically substantially neutral when treated with an base.

By incorporating one or more of such amphoteric polymers into an electrophoretic composition, treatment of the composition with a base renders the composition anaphoretic; and treatment of the composition with an acid solution renders the composition cataphoretic. Employing this amphoteric polymer in a radiation sensitive composition also allows the use of either acidic or basic compounds or compositions to develop and strip the electrodeposited composition, irrespective of whether the composition was applied cataphoretically or anaphoretically.

The compositions of the invention can be formed by admixing a suitable amphoteric polymer and a radiation sensitive component, such as a photoinitiator compound, that enables crosslinking, hardening or curing of the composition upon exposure to activating radiation. The compositions may include other components such as crosslinkable monomers and oligomers or, for an electrodepositable formulation, coalescing agents to promote formation of a uniform film layer during electrodeposition and subsequent baking.

A preferred embodiment of the invention provides a negative-acting electrophoretic composition that comprises the above described amphoteric polymer, an unsaturated material which preferably is an unsaturated monomer, and at least one photoactive compound. The components of this composition cure, crosslink or harden upon exposure to activating radiation. Monomers having two or more unsaturated groups attached to a single molecule are particularly preferred. Preferably this negative-acting composition further comprises a coalescing agent.

It has been found that the compositions of the invention are also suitably formulated as liquid coating compositions or used to form a dry film resist. For a liquid coating composition, the amphoteric polymer and radiation sensitive component are admixed in a suitable liquid carrier. The liquid coating compositions preferably also contain an unsaturated material such as unsaturated monomers or oligomers, preferably unsaturated monomers.

While the compositions of the invention have utility in a wide variety of applications, the compositions are particularly suitable for use in the manufacture of electronic printed circuit boards and other electronic packaging substrates. Accordingly, processes are provided for the manufacture of printed circuit board substrates including processes for permanently altering a conductive surface for the preparation of a printed circuit board. The compositions of the invention are also particularly suitable for the manufacture of lead frames. Also provided are novel articles of manufacture coated with the compositions of the invention.

"Permanent alteration" of a conductive surface, as used herein, is intended to include any treatment in a manner that permanently alters the conductive surface such as by etching to remove metal; or adding metal by means such as electroplating or electroless methods.

The term "conductive surface" as used herein means any surface sufficiently conductive to permit electrophoretic deposition of an organic coating composition. Metal surfaces are preferred conductive surfaces and include without limitation, copper, nickel, aluminum, titanium, gold, palladium, etc., and alloys thereof. For the manufacture of printed circuits, the conductive surface would typically comprise a copper layer over a dielectric base material such as epoxy, polyimide, tetrafluoroethylene, PES, polyetherimide and the like.

As used herein, the terms "crosslink" or "crosslinking" refer to any reaction of the crosslinking agent(s) of the compositions of the invention that results in reduced developer solubility of the composition.

DETAILED DESCRIPTION OF THE INVENTION

The amphoteric polymer component of the compositions of the invention contain carrier groups that become positively or negatively charged upon treatment with an acid or base respectively. Suitable amphoteric polymers are addition and condensation polymers that incorporate ethylenic unsaturation (i.e., groups having one or more carbon-carbon double bonds) on the polymer backbone itself and/or pendant groups attached to the polymer. Other suitable polymers are those that are free of ethylenic unsaturation, and utilize compounds containing unsaturated groups such as crosslinkable monomers and oligomers to form a photoinitiated crosslinked negative image. Amphoteric polymers suitable for use in the compositions of the invention include, for example, acrylic and other vinyl polymers, epoxy polymers, polyurethanes, polyesters, polyamides, and copolymers thereof. Addition polymers having carrier groups prepared from monomers having ethylenic unsaturation are generally preferred.

Suitable cataphoretic carrier groups are for example, quaternary ammonium groups, sulfonium groups and sulfoxonium groups. Other cataphoretic groups, such as amine groups, may also be used. Acids that are useful to ionize or polarize these groups include lactic acid, acetic acid, glycolic acid, hydroxyacetic acid, hydrochloric acid and phosphoric acid.

Suitable anaphoretic carrier groups are for example, carboxylate groups. Bases that are useful to ionize or polarize these groups include triethanolamine, potassium hydroxide, triethylamine and morpholine.

The mole ratio of the cataphoretic carrier groups to anaphoretic carrier groups of the described amphoteric polymer in general may vary widely. For example, the mole ratio of cataphoretic carrier groups to anaphoretic carrier groups of the polymer may suitably vary from about 5:95 to 95:5, more preferably from about 1:2 to 2:1. A mole ratio of the cataphoretic groups to the anaphoretic groups of about 1:1 is particularly suitable.

The compositions of the invention may contain one or more of the described amphoteric polymers. For a given electrodepositable composition, the one or more amphoteric polymers should contain sufficient charged carrier groups after treatment with an ionizer solution to render the composition sufficiently water dispersible and capable of being electrodeposited onto a conductive surface.

The amphoteric polymer of the invention is synthesized by procedures known in the art, and specific reaction conditions can be readily determined by the skilled artisan based on the constituents used. Free radical polymerization is particularly suitable. Typical reaction conditions include admixing a plurality of monomers in a suitable solvent and condensing the monomers by means of a free radical initiator. At least one of the monomers will comprise one or more cataphoretic carrier groups and at least one of the monomers will comprise one or more anaphoretic carrier groups. Suitable monomers comprising anaphoretic carrier groups include, for example, methacrylic acid and acrylic acid. Suitable monomers comprising cataphoretic carrier groups include, for example, 2-(dimethylamino)ethyl methacrylate, 3-(dimethylamino) propylmethacrylamide and t-butylamino ethylmethacrylate. A solution of the monomers is suitably added to a reaction vessel over time with simultaneous addition of a solution of a free radical initiator solution such as t-butyl peroctoate in a suitable solvent. The reaction mixture is suitably heated to about 100° C. or more to complete the condensation reaction. Ethylenic unsaturation can be introduced to the polymer by condensation of the thus formed amphoteric polymer with a compound comprising an ethylenic moiety, for example isocyanatoethylmethacrylate.

Virtually any polymer that contains sufficient cataphoretic and anaphoretic carrier groups is suitable for use as the amphoteric polymer in accordance with the invention. For example, epoxy amphoteric polymers are suitable, typically prepared by reaction of di-epoxides with diols, diamines or dicarboxylic acids. The polymerization of a di-epoxide with a diol can be carried out in the presence of an amine to incorporate cataphoretic carrier groups into the polymer, and anaphoretic carrier groups can be incorporated into the polymer by chemical reactions which attach carboxylic acid moieties to the epoxy polymer. Preparation of suitable polymers that contain carrier groups are described in U.S. Pat. No. 4,592,816, incorporated herein by reference, with the described procedures being modified whereby a polymer is synthesized containing both cataphoretic and anaphoretic carrier groups.

Preferred compositions of the invention are formed by mixing the amphoteric polymer with a radiation sensitive component such as a photoinitiator. A more preferred composition is formed by mixing the amphoteric polymer, the radiation sensitive component and a compound comprising unsaturated groups such as an unsaturated monomer or oligomer, so that the film deposited on the surface is capable of being polymerized into a crosslinked polymer network when exposed to activating radiation. Suitable unsaturated groups include ethylenic groups. Monomers having two or more unsaturated groups attached to the same molecule are preferred sources of unsaturation. Most preferred are the multi-functional monomers having two or more acrylate or methacrylate groups attached to each monomer molecule. A wide variety of specific unsaturated monomers are suitable and include, for example, alkyl methacrylate, 1,4-benzenediol diacrylate, bisphenol-A diacrylate and crotyl acrylate. Examples of other suitable monomers are set forth in U.S. Pat. No. 4,877,818, incorporated herein by reference.

Suitable radiation sensitive components include photoinitiator compounds that will cause polymerization of the unsaturated components of a composition of the invention upon exposure to radiation of an activating wavelength. Examples of suitable photoinitiator compounds for use in the invention include the azo compounds, sulfur-containing compounds, metallic salts and complexes, oxines, amines, polynuclear compounds, organic carbonyl compounds, various quinones, etc. Preferred photoinitiators include 3-phenyl-5-isoxazolone/benzanthrone, 2-t-butylanthraquinone, 2,2-dimethoxy-2-phenylacetophenone, 1-hydroxycyclohexyl phenyl ketone, and diethoxyacetophenone. Other suitable photoinitiator compounds are set forth in U.S. Pat. No. 4,592,816, incorporated herein by reference. The radiation sensitive component of a composition of the invention should be present in an amount sufficient to enable development of a coating layer of the composition following exposure to activating radiation.

In order to promote uniform electrodeposition of the radiation sensitive composition to a metallized substrate, a coalescing or leveling agent can be added. Such coalescing agents allow the film to better form during deposition and subsequent baking.

Preferred coalescing agents include both water or partially water soluble and water insoluble agents. Of the water soluble or partially water soluble agents, the preferred agents include 1-nitropropane, 2-nitropropane, methyl pyrrolidone and propylene glycol methyl ether. Other coalescing agents include copolymers of ethyl acrylate such as Modaflow (Monsanto), ethylene glycol ethyl hexyl ether, Texanol ® (2,2,4-trimethyl-1,3-pentanediol monoisobutyrate) (Eastman Kodak) and surfactants such as Flexrecin (CasChem).

Preferably, the coalescing agent is added in conjunction with photoinitiator compounds, dyes and inhibitors prior to emulsification of the electrodeposition composition. The amount of coalescing agent employed may vary depending on a number of factors including the partition coefficient between the organic and aqueous phases. A good discussion of such factors is described in T.N. Visser, in Selecting Solvents For Electrodeposit Paints, FATIPEC, 18th (Vol. 1-B) at pages 367-394 (1986), incorporated herein by reference.

In general, for water soluble or partially water-soluble coalescing agents, the amount may be up to about 25% by weight of the emulsion (including both solids and the aqueous portion), preferably between about 10-20% by weight, and most preferably between about 14-18% by weight. For water insoluble coalescing agents, the amount may be up to about 15% by weight of the solids used to form the emulsion, preferably between 2-10% by weight, and most preferably between 4-6% by weight.

Stabilizing agents may be added to the emulsion to prevent premature crosslinking of the monomers and/or polymers. Suitable stabilizing agents include hydroquinone, phenothiazine, methoxy hydroquinone and tert-butyl catechol. The amount of stabilizing agent employed will vary depending on a number of factors including the operating temperature and degree of mechanical shear experienced by the emulsion. In general, the amount may be up to about 3% by weight of the emulsion solids.

Dyes may also be used in order to enhance visual contrast and to facilitate inspection and subsequent repair (if necessary) when the photoresist is applied.

Preferred dyes include the triarylmethane dyes such as methyl violet, the anthraquinones such as Oil Blue N and the like. The amount of dye used generally depends on the thickness of the photoresist deposited. Typically the amount of dye used is less than 1% by weight of the emulsion solids for applied photoresist thicknesses of 15 microns or more. Thinner photoresist coatings may require the use of more dye to maintain the visual contrast between the substrate and the photoresist.

In general, the electrophoretic compositions of the invention are formed by mixing a solution of the amphoteric polymers with (when employed) an unsaturated material such as one or more unsaturated crosslinking monomers. The photoinitiator compound(s), dye, stabilizer and other additives are dissolved in a suitable solvent and added to the resin mixture. Suitable solvents include glycol ethers such as propylene glycol methyl ether, ethylene glycol ethyl hexyl ether, and mixtures thereof. At this point, the resin composition may be emulsified for cataphoretic electrodeposition processes by treatment with a suitable acidic ionizer such as lactic acid; or to produce an anaphoretic electrodeposition bath, the resin composition may be treated with a basic ionizer such as triethanolamine. After the composition is completely mixed, water is slowly added while stirring to form the emulsion. The solids content of the emulsion can be adjusted by diluting the emulsion with additional water.

In general, the electrodepositable compositions of the invention are applied to a substrate in the same manner as prior electrodepositable compositions. For example, to apply a composition of the invention that has been treated with an acidic ionizer, a substrate having a conductive surface (e.g. a copper clad printed circuit board substrate) is immersed in the aqueous mixture to serve as the cathode. A stainless steel bar or other suitable material is immersed in the solution to serve as the anode. The electrodes are connected to an electrical potential. Factors that can affect film thickness include applied voltage, the time that voltage is applied, the anode/cathode distance, and the temperature of the photoresist emulsion. After electrodeposition of the composition, the conductive substrate is removed from the solution or emulsion, deionized water rinsed and dried, and optionally baked at about 100° C. to dry and further coalesce the film. After the water rinse, the coated substrate can be immersed in a hydroxy cellulose-based solution for tack reduction such as EAGLE 2002 topcoat solution (sold by Shipley Company of Newton, Mass.). This general procedure is also suitable for anaphoretic deposition. After the composition of the invention has been treated with a basic ionizer, the conductive substrate is used as the anode and the inert counter electrode is used as the cathode.

Preferably the conductive substrate is vibrated during electrolysis at a sufficient frequency and amplitude to dislodge any gases that may adhere to the substrate surface. Gases often adhere to the substrate surface, and upon electrodeposition can result in pinholes or other coating flaws. The conductive surface is conveniently vibrated by attaching a suitable motor to the deposition vessel. For example, an electric type motor or pneumatic type motor may be used, although it is clear that other devices capable of providing the described vibrations could be employed, for example a transducer. In general, the vibrating device is operated to provide between about 600 and 30,000 vibrations per minute and, preferably, at least about 3,000 vibrations per minute. Preferably, the vibration device is mounted on the deposition vessel whereby the vibrations are isolated and transferred directly to the conductive substrate disposed in the bath.

Exposure of the electrodeposited composition is achieved by use of an appropriate phototool that contains areas that are selectively opaque and transparent to activating radiation. See D.S. Elliot, *Integrated Circuit Fabrication Technology*, ch. 8, p. 165–207, incorporated herein by reference. In general, the substrate coating is exposed by placing the phototool between the substrate and the source of activating radiation, and then exposing the coating film through the mask.

The compositions of the invention enable development of the unexposed regions of a coating layer with either acidic or basic solutions. To facilitate dissolution of unexposed regions a developer solution preferably contains one or more surfactants and, more preferably, an acidic developer solution contains one or more acidic surfactants and a basic developer solution contains one or more basic surfactants. A suitable basic developer solution is a one weight percent aqueous sodium carbonate solution containing about 2 weight percent of an alkaline surfactant such as Tetronic 304 (BASF Co.). Suitable use of this developer provides immersing the exposed substrate in the developer solution heated to about 50° C. for twice the time required to remove the unexposed resist. An aqueous lactic acid solution, such as 4% EAGLE Developer 2005 (sold by Shipley Co.), is a suitable acidic developer.

The areas of the conductive substrate that are bared upon development may then be permanently altered, for example selectively plated or chemically etched by known procedures.

After such processing, the remaining resist composition on the substrate may be removed with either acid or base chemistries, irrespective of whether the composition was applied anaphoretically or cataphoretically, or whether the composition was developed with acidic or basic compounds or compositions.

As noted, the radiation sensitive compositions of the invention are particularly useful for the manufacture of printed circuit boards, for example in a print-and-etch process and a print-and-plate process. The compositions of the invention are also especially useful for the manufacture of three-dimensional circuit boards by processes as disclosed in U.S. Pat. No. 5,004,672, incorporated herein by reference.

The compositions of the invention are also useful for the manufacture of lead frames. A lead frame is a sheet metal framework on which an integrated circuit is attached and electrically connected to an electronic printed circuit board. The lead frame provides a mounting surface for a microelectronic integrated circuit from which multiple conductive "leads" laterally extend. Each lead is spaced from each adjacent lead to provide a conductive pathway. The top surface of the leads are selectively plated with a conductive metal such as gold or silver to electrically connect individual pads of an integrated circuit to the board circuitry. The lead frame primary structure can be formed by chemically etching a suitable conductive substrate such as copper or nickel alloy foil that has been imaged with the composition of the invention as described above. A particularly suitable substrate is a copper alloy 194 foil sheet (sold by Olin Chemical). For plating the top surface of the leads, the composition of the invention is deposited and then exposed and developed to bare only the top surface of the leads. These top lead surfaces which are bared of the resist composition upon development then are plated, for example electroplated with a gold plating bath to provide a 30 microinch gold deposit. Preferably, the top lead surfaces are cleaned of substantially all traces of organics before plating.

As noted above, a radiation sensitive composition comprising the amphoteric polymer having cataphoretic and anaphoretic carrier groups, a radiation sensitive component such as the described photoinitiator and, preferably, a source of unsaturation for a crosslinking reaction upon exposure of the composition to activating radiation, can be applied to a substrate by film forming methods other than electrodeposition. For example, the composition can be formulated as a liquid coating composition and applied to a substrate by spin coating, roller coating, dip coating, slot coating or other coating techniques known in the art. The compositions of the invention also may be applied on a substrate as a dry film.

A liquid coating composition is generally prepared following prior art procedures for the preparation of photoresists and other photocurable compositions. The solids portion of a composition of the invention is formulated by dissolving the solids in a suitable solvent such as, for example, glycol ethers such as ethylene glycol monomethyl ether, ethylene glycol dimethyl ether, methoxy benzene and the like; Cellosolve ® esters such as methyl Cellosolve acetate, ethyl Cellosolve acetate and propylene glycol monomethyl ether acetate; aromatic hydrocarbons such as toluene, xylene and the like; ketones such as acetone, methyl ethyl ketone, cyclopentanone, cyclohexanone; esters such as ethyl acetate, butyl acetate, hexyl acetate, isobutyl isobutyrate and butyrolactone; amides such dimethylacetamide and dimethyl formamide; chlorinated hydrocarbons such as methylene chloride, ethylene dichloride 1,1,1-trichloroethane, chlorobenzene and ortho-dichlorobenzene; nitrobenzene; dimethyl sulfoxide; alcohols such as diacetone alcohol; and mixtures of the foregoing.

The total solids content of the liquid coating compositions typically does not exceed about 60 to 70 percent by weight of the formulation and, preferably, the solids content varies between about 10 and 50 percent by weight of the total composition. When spin coating, the solids content of the coating solution can be adjusted to provide a desired film thickness based upon the specific spinning equipment utilized, the viscosity of the solution, the speed of the spinner and the amount of time allowed for spinning.

After application of the liquid coating composition onto a surface, it is typically subjected to a pre-exposure soft bake, e.g., heated to about 90° C. to remove solvent until preferably the resist coating is tack free. The coating composition is then imaged and processed as generally described above.

A liquid coating composition of the invention may also be used to form a dry film photoresist. A dry film resist is typically produced by coating the liquid coating composition onto a suitable support such as a polyolefin film and then covering the resist film with a thin polymer film, for example a polyester film. The thin film is peeled away prior to use and the solid resist layer is applied to a substrate surface. See, generally, W. DeForest, *Photoresist Materials and Processes*, pp. 163-212 (McGraw Hill 1975), incorporated herein by reference, and the patents incorporated herein above.

The compositions of the invention also may be applied over silicon or silicon dioxide wafers for the production of microprocessors and other integrated circuit components. Microelectronic wafers composed of materials also will be suitably coated with the compositions of the invention, for example aluminum—aluminum oxide and silicon nitride wafers.

The following examples are presented to better illustrate the invention, but are not to be construed as limiting the invention to the specific embodiments disclosed.

EXAMPLE 1

Preparation of a saturated amphoteric polymer solution 910 grams of propylene glycol methyl ether solvent was placed in a four-neck round bottom flask fitted with a mechanical stirrer, nitrogen inlet tube, condenser and thermometer. Nitrogen gas was bubbled through the solvent and exhausted through an oil bubbler, attached to the condenser to degas the solvent and flush the air from the reaction vessel. The nitrogen inlet tube was raised above the level of the solvent and a flow was maintained to keep a positive pressure of nitrogen in the flask throughout the reaction. A thermostatically controlled heating mantle was fitted to the underside of the flask and the solvent was heated to 105° C. A free radical initiator solution was prepared by adding 13 grams of t-butyl peroctoate to 117 grams of propylene glycol methyl ether. A monomer mixture was prepared by combining 100 grams of methacrylic acid, 80 grams of 2-(dimethylamino)ethyl methacrylate, 330 grams of butyl methacrylate, and 490 grams of methyl methacrylate for a total weight of 1000 grams (1060 milliliters). The monomer mixture was pumped into the reaction flask at a rate of 5 ml/min while simultaneously pumping the initiator solution at a rate of 0.5 ml/min. An additional 0.6 grams of t-butyl peroctoate was added to the reaction flask 30 minutes after addition of all the monomer mixture. The polymer solution had a solids content of 50 percent.

EXAMPLE 2

Preparation of an amphoteric polymer solution containing pendant ethylenic unsaturation The same reaction apparatus was prepared as in Example 1 with the following changes: solvent was changed to diglyme; the amount of free radical initiator was 20 grams of t-butyl peroctoate in 80 grams of diglyme; the monomer mixture consisted of 170 grams of methacrylic acid, 100 grams of 2-(dimethylamino)ethyl methacrylate, 351 grams of butyl methacrylate, and 379 grams of methyl methacrylate. The reaction was conducted as in Example 1. 90 grams of the resulting polymer solution was diluted with 83 grams of diglyme and further reacted with 5.72 grams of isocyanatoethylmethacrylate at 25° C. for 24 hours. The isocyanatoethylmethacrylate reacted with approximately 7% of the available 17% methacrylic acid groups incorporated into the polymer backbone to attach pendant ethylenic unsaturated groups to the polymer.

EXAMPLE 3

Cathodic amphoteric photoresist composition developed and stripped in base solutions for a print and etch application Step 1: Preparation of the Electrodepositable Photoresist The following components of a cathodic electrodepositable photoresist were added in order in the indicated amounts.

| Amphoteric polymer solution prepared in Example 1 | 160.8 grams |
|---|---|
| Monomers | |
| Photomer 6022 (Henkel Corp.) | 25.9 grams |
| Photomer 4094 (Henkel Corp.) | 25.6 grams |
| Solvent | |
| Propylene glycol methyl ether | 56.0 grams |
| Ethylene glycol ethyl hexyl ether | 12.4 grams |
| Dye | |
| Morton ERO Blue (Morton Thiokol) | 1.1 grams |
| Initiators | |
| Irgacure 907 (Ciba-Geigy) | 8.32 grams |
| 2-isopropylthioxanthone | 2.73 grams |
| Ionizer | |
| 20 wt. % Aqueous Lactic Acid Solution | 32.0 grams |
| Deionized water | to 1000.0 grams |

Step 2: Coating of the Electrodepositable Photoresist

The composition of Step 1 of this Example was heated to a temperature of 35° C. A 3 inch×6 inch stainless steel plate was used as the anode and the circuit board base material was used as the cathode. The anode to cathode spacing was 2 inches. A direct current voltage of 100 volts was applied across the electrodes for 15 seconds to apply the electrophoretic photoresist to the cathode at a thickness of 6 microns. The coating was then baked in a forced air convection oven at 115° C. for 3 minutes to dry and coalesce the film.

Step 3: Image and Developing the Photoresist

The coating was exposed to 75 mJ/cm$^2$ of UV radiation through a silver halide phototool to confer the desired pattern to the board. The board was then developed by immersion in a 1 wt. % sodium carbonate solution containing 2 wt. % surfactant such as Tetronic 304 (BASF Co.) at a temperature of 50° C. Typically the board is developed for twice the breakpoint (time required to remove the unexposed resist) of 30 seconds for a total time of 1 minute. A step 7 from a Stouffer 21 Step Tablet is typically retained after development.

Step 4: Etching Exposed Copper

A cupric chloride etchant was used for a sufficient time to remove the bared copper surface. Other suitable etchants include ferric chloride, sulfuric acid/hydrogen peroxide and ammoniacal.

Step 5: Removal of Photoresist

The photoresist was removed in a basic solution of 25% EAGLE REMOVER 2009 (Shipley Co.) at 50° C. The photoresist is typically removed within 10 seconds.

EXAMPLE 4

Cathodic amphoteric photoresist composition developed and stripped in base solutions for a print-and-plate applications The same steps 1, 2 and 3 of Example 3 above were followed.

Step 4: The imaged board was immersed into an acid-copper plating solution and current applied to electrolytically deposit the copper in the exposed area to a thickness of 6 microns.

Step 5: The board was then immersed into a tin/lead plating bath identified under the tradename ELECTROPOSIT 280 (Shipley Co.), to plate tin/lead over the exposed electroplated copper. An immersion time of 15 minutes at 25° C. and 15 ASF is sufficient to protect the electrolytic copper from subsequent etching.

Step 6: The photoresist is removed as in Step 5 of Example 3 above.

Step 7: The exposed underlying copper is then etched in a manner as in Step 4 of Example 3 above.

EXAMPLE 5

Cathodic amphoteric photoresist developed and stripped in acidic solutions

The same composition and process of Example 3 above were followed except that instead of a basic (sodium carbonate) developer being used, an acidic (lactic acid) developer was used. The exposed boards were immersed in 4% EAGLE DEVELOPER 2005 (Shipley Co.) at 37.5° C. for twice the breakpoint of 150 seconds. Typically step 8 of a Stouffer 21 Step Tablet is retained. The resist was removed in 33% EAGLE 2007 (lactic acid/surfactant solution) available from Shipley Co. Newton Mass., at 55° C.

EXAMPLE 6

Anodic amphoteric photoresist developed and stripped in basic solutions

The same composition and process of Example 3 above were used except that the ionizer was changed from lactic acid to 10.9 grams of 97% triethanolamine and the coating voltage was changed to 150 volts to produce coating thicknesses of 8 microns. The triethanolamine gives the emulsion micelles a negative charge rather than the positive charge that lactic acid imparts, thus allowing the photoresist composition to coat the circuit board base material as the anode. Typically a step 9 of a Stouffer 21 Step Tablet was retained after twice the breakpoint of 30 seconds.

EXAMPLE 7

Anodic amphoteric photoresist developed and stripped in acidic solutions

The same composition and process of Example 6 above were followed except that the coatings were developed and stripped in the lactic acid-based developer and stripper of Example 5. Typically a step 8 of a Stouffer 21 Step Tablet was retained after twice the breakpoint of 4 minutes.

EXAMPLE 8

Cathodic amphoteric photoresist containing unsaturated polymer that is developed and removed in base Step 1: Preparation of the Electrodepositable Photoresist The following components of a cathodic electrodepositable photoresist were added in order.

| Polymer solution from Example 2 | 31.6 grams |
|---|---|
| Monomers | |
| Photomer 6022 (Henkel Corp.) | 2.8 grams |
| Photomer 4094 (Henkel Corp.) | 2.8 grams |
| Initiators | |
| Irgacure 907 (Ciba-Geigy) | 0.9 grams |
| 2-isopropyl thioxanthone | 0.3 grams |
| Dye | |
| Morton ERO BLUE | 0.1 grams |
| Solvent | |
| Ethylene glycol ethyl hexyl ether | 1.3 grams |
| diglyme | 16.4 grams |

-continued

| Ionizer | |
|---|---|
| 50 wt. % aqueous lactic acid solution | 3.0 grams |
| Deionized water | to 100 grams |

Step 2: Coating the Photoresist

The photoresist was coated cathodically at 25° C., 100 volts for 15 seconds to obtain a thickness of 7.5 microns on a copper circuit board base material. The coating was oven baked at 110° C. for 2 minutes to dry and coalesce the film.

Step 3: Imaging the Photoresist

The photoresist was exposed to 100 mJ/cm$^2$ of ultraviolet light. The board was then developed in an aqueous solution containing 1 wt. % sodium carbonate and 2 wt. % Tetronic 304 at 50° C. for three times the breakpoint of 8 seconds for a total time of 25 seconds. Steps 4 and 5 of Example 3 above were then followed to etch the bared copper surface and remove the photoresist.

EXAMPLE 9

Cathodic amphoteric photoresist containing unsaturated polymer that is developed and removed in acid The same composition and process as Example 8 above were used except that the acidic developer and remover of Example 5 above was used.

EXAMPLE 10

Anodic amphoteric photoresist containing unsaturated polymer that is developed and removed in base The same composition and process of Example 8 above were used except that the ionizer was changed to 1.2 grams of triethanolamine and the photoresist was coated anaphoretically.

EXAMPLE 11

Anodic amphoteric photoresist containing unsaturated polymer that is developed and removed in acid The same composition and process of Example 10 above was used except that the photoresist was developed and stripped in the acidic solutions described in Example 5 above.

The foregoing description of the invention is merely illustrative thereof, and it is understood that variations and modifications can be effected without departing from the spirit or scope of the invention as set forth in the following claims.

What is claimed is:

1. A method for forming a relief image on a conductive surface of a substrate, comprising
    (a) electrophoretically applying a layer of a negative-acting photoresist composition on the conductive surface, the photoresist composition comprising a crosslinker, a radiation sensitive component that causes crosslinking of the crosslinker upon exposure to activating radiation, and a polymer comprising cataphoretic carrier groups and anaphoretic carrier groups in an amount sufficient to enable i) either anaphoretic or cataphoretic deposition of the photoresist composition, and (ii) development of the photoresist composition with either an alkaline agent or an acidic agent after imagewise exposure of the photoresist to activating radiation;
    (b) imagewise exposing the composition layer to activating radiation to form a crosslinked image in those areas of the composition layer exposed to activating radiation; and
    (c) developing the composition layer to remove those areas of the composition layer not exposed to activating radiation to thereby yield a relief image on the conductive surface.

2. The method of claim 1 where the substrate is vibrated during application of the composition whereby gas bubbles adhering to the substrate are dislodged.

3. The method of claim 1 where the substrate is selected from the group consisting of a printed circuit board and a lead frame substrate.

4. The method of claim 1 where the substrate is a metallized three dimensional circuit board substrate.

5. The method of claim 1 further comprising permanently altering surface areas bared of the composition upon development.

6. The method of claim 1 where the composition is applied cataphoretically.

7. The method of claim 6 where the imagewise exposed composition layer is developed with an acidic developer.

8. The method of claim 7 where the imagewise exposed composition layer is developed with an acidic developer solution that comprises one or more surfactants.

9. The method of claim 8 where the one or more surfactants are acidic.

10. The method of claim 6 where the imagewise exposed composition layer is developed with an alkaline developer.

11. The method of claim 10 where the composition layer is developed with an alkaline developer solution that comprises one or more surfactants.

12. The method of claim 11 where the one or more surfactants are alkaline.

13. The method of claim 6 further comprising, after said developing of the composition layer, removing the remaining radiation sensitive composition from the conductive surface with an acidic material.

14. The method of claim 6 further comprising, after said developing of the composition layer, removing the remaining radiation sensitive composition from the conductive surface with an alkaline material.

15. The method of claim 1 where the composition is applied anaphoretically.

16. The method of claim 15 where the imagewise exposed composition layer is developed with an acidic developer.

17. The method of claim 16 where the composition layer is developed with an acidic developer solution that comprises one or more surfactants.

18. The method of claim 17 where the one or more surfactants are acidic.

19. The method of claim 15 where the imagewise exposed composition layer is developed with an alkaline developer.

20. The method of claim 19 where the imagewise exposed composition layer is developed with an alkaline developer solution that comprises one or more surfactants.

21. The methods of claim 20 where the one or more surfactants are alkaline.

22. The method of claim 15 further comprising, after said developing of the composition layer, removing the remaining radiation sensitive composition from the conductive surface with an acidic material.

23. The method of claim 15 further comprising, after said developing of the composition layer, removing the remaining radiation sensitive composition from the conductive surface with an alkaline material.

24. The method of claim 1 where the polymer comprises one or more ethylenic unsaturated groups.

25. The method of claim 1 where the crosslinker is a compound that comprises unsaturated groups.

26. The method of claim 25 where the unsaturated compound is an unsaturated monomer.

27. The method of claim 26 consisting essentially of electrophoretically applying a layer of the photoresist composition on the substrate, imagewise exposing the composition layer to activating radiation, and developing the composition.

28. The method of claim 1 where the polymer comprising cataphoretic and anaphoretic groups is selected from the group consisting of vinyl polymers, epoxy polymers, polyurethanes, polyesters, polyamides, and copolymers thereof.

29. The method of claim 1 where the polymer comprising cataphoretic and anaphoretic groups is an acrylic polymer.

30. The method of claim 1 consisting essentially of electrophoretically applying a layer of the photoresist composition on the substrate, imagewise exposing the composition layer to activating radiation, and developing the composition.

* * * * *